(12) United States Patent
O'Donnell

(10) Patent No.: US 12,369,266 B2
(45) Date of Patent: Jul. 22, 2025

(54) RACK EAR SERVICE LIGHT

(71) Applicant: Dell Products L.P., Round Rock, TX (US)

(72) Inventor: Sean P. O'Donnell, Poughkeepsie, NY (US)

(73) Assignee: Dell Products L.P., Round Rock, TX (US)

(*) Notice: Subject to any disclaimer, the term of this patent is extended or adjusted under 35 U.S.C. 154(b) by 178 days.

(21) Appl. No.: 18/496,240

(22) Filed: Oct. 27, 2023

(65) Prior Publication Data

US 2025/0142760 A1 May 1, 2025

(51) Int. Cl.
H05K 7/14 (2006.01)
F21S 9/02 (2006.01)

(52) U.S. Cl.
CPC ............. H05K 7/1488 (2013.01); F21S 9/02 (2013.01)

(58) Field of Classification Search
CPC .. H05K 7/1492; H05K 7/1487; H05K 7/1488; H05K 7/1489; H05K 7/1461; H05K 7/20145; H05K 7/20727; H05K 7/20754; G06F 1/188; G06F 1/181; G06F 1/20; G06F 1/184; G06F 1/187; G06F 1/189
See application file for complete search history.

(56) References Cited

U.S. PATENT DOCUMENTS

| | | | |
|---|---|---|---|
| 7,002,799 B2 | 2/2006 | Malone et al. | |
| 7,324,006 B2* | 1/2008 | Godard | H01R 25/00 361/64 |
| 8,416,565 B1* | 4/2013 | Ross | H05K 7/1492 345/173 |
| 8,480,420 B2* | 7/2013 | Ziobro | F21V 33/006 439/214 |
| 8,817,463 B1* | 8/2014 | Rose | G06F 1/189 361/825 |
| 8,941,993 B2 | 1/2015 | Eckberg et al. | |
| 9,627,873 B2* | 4/2017 | Makwinski | H02G 3/26 |
| 10,566,746 B1* | 2/2020 | Breeden | H01R 24/78 |
| 10,660,231 B2* | 5/2020 | Franz | H01R 25/006 |
| 2007/0159775 A1* | 7/2007 | Ewing | H02B 1/306 361/642 |
| 2012/0162910 A1* | 6/2012 | Jai | G06F 1/189 361/679.58 |

* cited by examiner

Primary Examiner — Abhishek M Rathod
(74) Attorney, Agent, or Firm — WOMBLE BOND DICKINSON (US) LLP

(57) ABSTRACT

Methods, systems, and devices for providing computer implemented services are disclosed. To provide the computer implemented services, a data processing system may include various hardware components within an interior of a chassis. To provide sufficient illumination to enable visibility and interaction with the hardware components, the data processing system may include an integrated service light adapted to illuminate portions of the data processing system. To integrate the service light, the data processing system may include a service light receiver that is positioned with an ear of the chassis and adapted to receive the service light to, at least temporarily, retain the service light in a first position and a first orientation. By doing so, the service light may enable visibility and interaction with the hardware components without limiting access to the hardware components.

20 Claims, 8 Drawing Sheets

RACK EAR SERVICE LIGHT

FIELD

Embodiments disclosed herein relate generally to device management. More particularly, embodiments disclosed herein relate to managing maintenance of devices.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
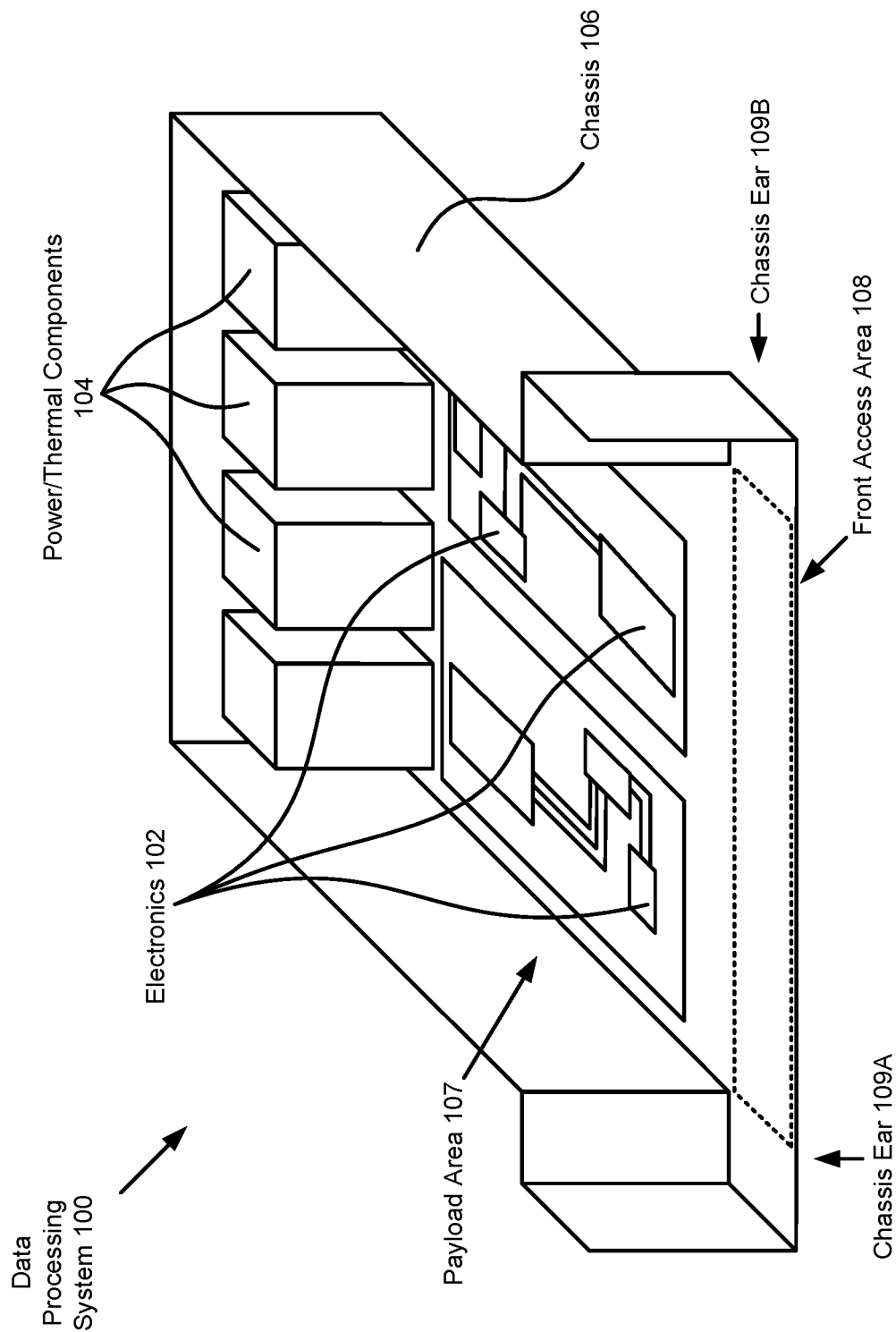
FIGS. 1A-1B show block diagrams illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing, at least in part, computer implemented services. To provide the services, a data processing system may include any number of hardware components (e.g., storage devices, memory modules, processors, etc.) operating in a predetermined operating state and positioned in a chassis.

For example, the predetermined operating state may be a nominal operating state conducive to contributing toward the computer implemented services, and the chassis may be a form factor compliant (e.g., a 1/2U sled) enclosure.

However, if the hardware components are not in the predetermined operating state, various maintenance actions for the hardware components may need to be performed. To do so, for example, a technician may need or otherwise be required to visually inspect, physically interact, and/or otherwise be able to identify and interact with the hardware components in the chassis.

However, the chassis may reside in a dark environment and/or may otherwise not be sufficiently illuminated to enable visibility and interaction with the hardware components. Consequently, hardware components positioned in the chassis may not be visible to the technician, thereby limiting the ability of maintenance for the hardware components to proceed. For example, without proper visibility of the hardware components, attempts to provide maintenance may prevent the technician from being able to identify the hardware components that may need to be replaced and/or otherwise maintained. Consequently, the maintenance may be delayed and/or prevented entirely.

To provide sufficient illumination to enable visibility and interaction with the hardware components even while the chassis resides in a dark environment, a service light may be integrated with the chassis. For example, the service light may be housed in an ear of the chassis and may provide a source of illumination within the chassis.

Thus, a light field projected by the source of illumination may enable identification of and interaction with the hardware components when the hardware components reside in an environment that may lack sufficient and/or directed illumination to enable technicians to sufficiently see and interact with hardware components of the data processing system.

In an embodiment, a data processing system is provided. The data processing system may include a chassis that may include a payload area to: house hardware components, facilitate introduction of at least a portion of the hardware components to an interior of the chassis, and facilitate removal of the at least a portion of the hardware components from the interior of the chassis, and an ear positioned with a front of the chassis and to a side of the payload area; the hardware components positioned with the chassis; a service light adapted to illuminate portions of the data processing system; and a service light receiver that is positioned with the ear and adapted to receive the service light to retain the service light in a first position and a first orientation.

While received by the service light receiver, the service light may be positioned in the ear.

While received by the service light receiver, the service light may be adapted to project a light field directed toward an interior of the chassis to illuminate a first portion of the portions of the data processing system.

The projected light field may be oriented, at least in part, from the ear of the chassis toward a second ear of the chassis.

The service light receiver may be adapted to power the service light.

The service light receiver may include a dock for the service light, and the service light may include a rechargeable battery charged using the dock while the service light is received by the service light receiver.

The service light receiver may include a tether to the service light.

The tether may supply power to the service light.

While the service light is detached from the service light receiver, the service light may be unrestricted in its position and orientation to illuminate at least a second portion of the portions of the data processing system.

While received by the service light receiver, the service light may not restrict access to the at least the portion of the hardware components.

The data processing system may further include a security bezel adapted to reversibly attach to the chassis, and when attached to the chassis the security bezel limits access to the service light.

In an embodiment, a rack system is provided that may include the data processing system as discussed above.

Turning to FIG. 1A, a first diagram illustrating a data processing system in accordance with an embodiment is shown. The data processing system shown in FIG. 1A may provide computer implemented services. The computer implemented services may include any type and/or quantity of computer implemented services. For example, the computer implemented services may include data storage services, instant messaging services, database services, and/or any other type of service that may be implemented with a computing device.

To provide the computer implemented services, the data processing system may include various hardware components. These hardware components may facilitate various functionalities of a data processing system (e.g., 100). For example, to provide the computer implemented services, data processing system 100 may include electronics 102, power/thermal components 104, and chassis 106. Each of these is discussed below.

Electronics 102 may include various types of hardware components such as processors, memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 104 may power any of the components of data processing system 100 and/or thermally manage any of the components of data processing system 100. For example, power/thermal components 104 may include power supplies, fans, and/or other types of devices usable to power and/or thermally manage the components.

Any of the components of data processing system 100 may be positioned in an interior of chassis 106. Chassis 106 may facilitate placement and/or management of the hardware components and/or other components in a computing environment. To provide its functionality, chassis 106 may include payload area 107, front access area 108, and chassis ears 109A-109B. Each of these portions of chassis 106 is discussed below.

Payload area 107 may (i) house at least a portion of the hardware components, and (ii) facilitate introduction of and/or removal of at least a portion of the hardware components to and/or from an interior of chassis 106. Thus, payload area 107 may facilitate placement and/or management of at least a portion of the hardware components.

To provide its functionality, payload area 107 may be implemented using a first portion (e.g., a largest portion from a set of portions making up the interior) of chassis 106. Payload area 107 may be positioned with other portions of chassis 106 to allow passage between the interior (e.g., a position within payload area 107) and an exterior of chassis 106 (discussed further below with regard to an opening in chassis 106).

For example, the first portion may (i) house the physical structures of electronics 102 and power/thermal components 104 (previously discussed), and (ii) be positioned with a second portion of chassis 106 (e.g., front access area 108, discussed below).

As noted above, front access area 108 may be a second portion (e.g., a substantially unobstructed portion from the set of the portions making up the interior) of chassis 106. Front access area 108 may be adapted to provide passage within the interior of chassis 106 between payload area 107 and the exterior of chassis 106. To do so, front access area 108 may include an opening (e.g., on a front of chassis 106 as depicted in FIG. 1A) through which access to the hardware components of data processing system 100 is provided. For example, the access may facilitate insertion and/or removal of hot swap components for chassis 106. Additionally, the opening may facilitate airflow into and/or out of chassis 106, thereby providing additional thermal management (e.g., cooling) for data processing system 100.

By providing the passage from payload area 107 to the exterior of chassis 106 through the opening (and/or vice versa), at least a portion of front access area 108 may facilitate placement and/or management of the hardware components.

Figure 1B:
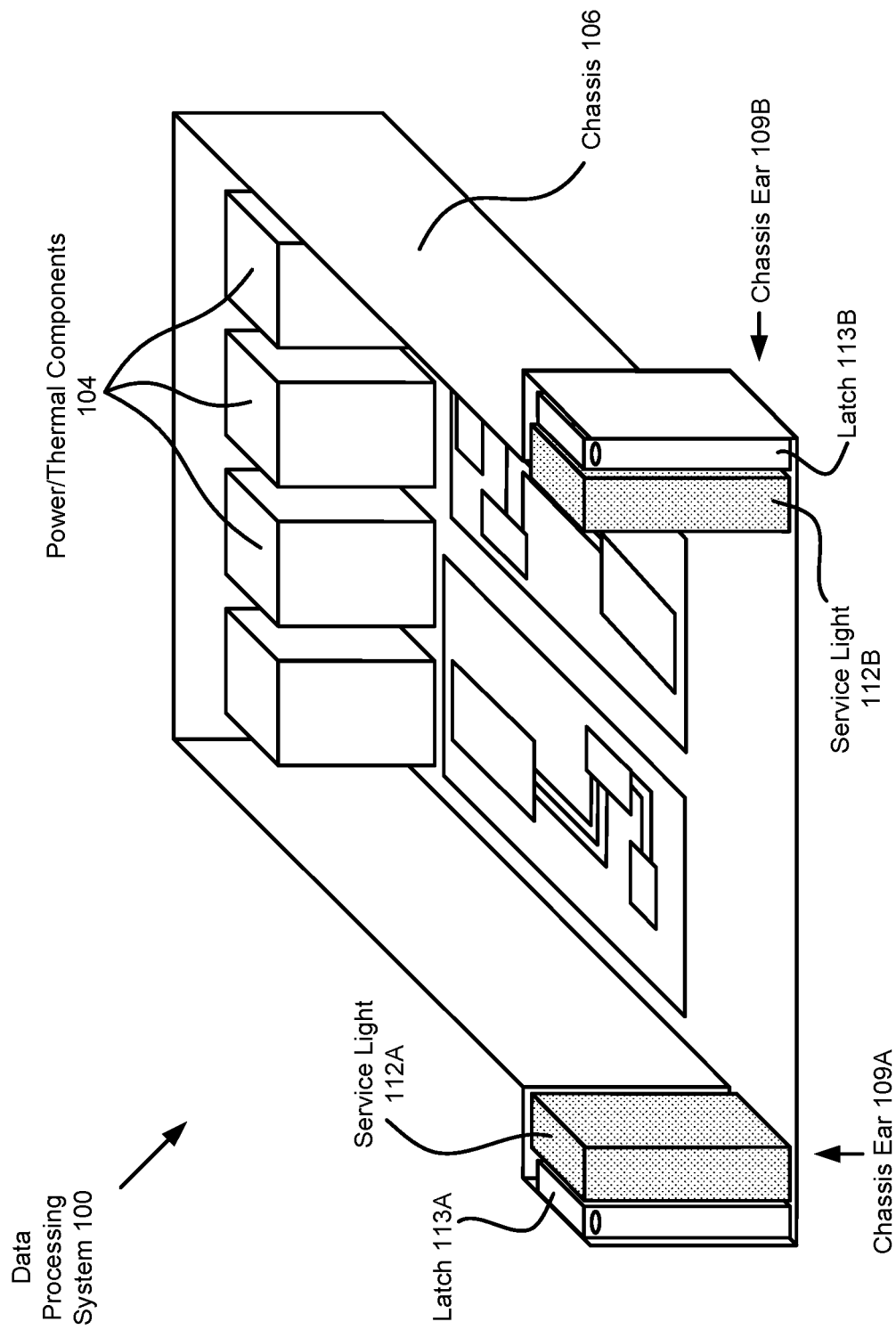

Chassis ears 109A-109B may facilitate (i) attachment of chassis 106 to rails and/or other enclosure components for housing chassis 106, (ii) may house latches and/or other components to enable the attachment, and (iii) may provide additional space within the interior of chassis 106 in which management components may be positioned (e.g., such as a service light, refer to FIG. 1B for additional details). This additional space provided by the ears may be positioned on either lateral side of front access area 108 and may extend away from front access area 108. By doing so, chassis ears 109A-109B may facilitate positioning of chassis 106 with regard to, for example, a rack mount chassis system as well as other functionalities.

As previously discussed, the hardware components positioned in payload area 107 may contribute toward the performance of desired computer implemented services. However, to do so, the hardware components may need to be in a predetermined operating state (e.g., a nominal operate state conducive to contributing toward the computer implemented services).

If the hardware components are not in the predetermined operating state, various maintenance actions for the hardware components may need to be performed. For example, a technician or other person may need or otherwise be required to visually inspect, physically interact, and/or otherwise be able to identify and interact with the hardware components.

To perform the maintenance actions, the technician may approach chassis 106 and attempt to visually identify hardware components that are not in the predetermined operating state. However, to do so, sufficient illumination may need to be present so that the technician is able to see and touch the corresponding hardware components.

In general, embodiments disclosed herein relate to system, methods, and devices to facilitate placing hardware components into the predetermined operating states. To do so, a data processing system in accordance with an embodiment may include a source of illumination integrated with chassis 106. For example, the source of illumination may be integrated with one or more ears of chassis 106.

By integrating the sources of illumination with ears of the chassis, a light field projected by the source of illumination may enable identification and interaction with hardware components of the data processing system even while the data processing system is positioned in dark environment that may lack sufficient and/or directed illumination to enable technicians to sufficiently see and interact with hardware components of the data processing system.

Additionally, by placing the sources of illumination in the ears of chassis 106, the sources of illumination may not block access to hardware components via the opening in the chassis. Thus, while in a rest position, the sources of illumination may project light fields that enable the hardware components to be seen even while they are removed and/or inserted into chassis 106 via the opening.

Further, by placing the sources of illumination in the ears of chassis 106, the sources of illumination may be secured using a security bezel. For example, while position with the ears, the security bezel may restrict access to the sources of illumination.

Lastly, the sources of illumination may be selectively moved and/or repositioned at least temporarily to facilitate projection of light fields on various portions of the data processing system. For example, the sources of illumination may be move and/or repositioned to change the direction of projection of the light fields. By doing so, various portions of the data processing system not illuminated by the light fields while the sources of illumination are the rest positions may be illuminated. Refer to FIG. 1B for additional details regarding sources of illumination.

While illustrated in FIG. 1A with a limited number of specific components, a data processing system may include additional, fewer, and/or different components without departing from embodiments disclosed herein.

Turning to FIG. 1B, a second diagram illustrating data processing system 100 in accordance with an embodiment is shown.

As previously discussed, data processing system 100 may include chassis ears 109A-109B. These ears may facilitate attachments between chassis 106 and other structures (e.g., a rack mount system, a security bezel, etc.) while also providing additional space within the interior of chassis 106 in which management components may be positioned. To provide its functionality, each chassis ear may include two portions, each of which is discussed below.

A first portion of the two portions may provide space for a latching mechanism. For example, the first portion of an ear may include either of latches 113A-113B.

Latches 113A-113B may facilitate reversible attachment between chassis 106 and, for example, a security bezel over an opening in chassis 106. To do so, each of latches 113A-113B may be implemented with a structural member that is actuatable by a person. The actuation may enable mechanical coupling or decoupling between other structural members of chassis 106 and structural members of, for example, the security bezel.

Although described with respect to a security bezel, latches 113A-113B may facilitate attachments between chassis 106 and other structures not to be limited by embodiments herein.

A second portion of the two portions may provide space for a management component. For example, the second portion of the ear may include either of service slights 112A-112B.

Service Lights 112A-112B may be sources of illumination that illuminate portions of data processing system 100, thereby enabling visibility of the portions even while the portions are positioned in dark or dim environments. To do so, each of service lights 112A-112B may project a light field that covers an area. The area upon which the light field is projected may be based on a position of the light field's source, and portions of data processing system 100 covered by the area may be illuminated.

For additional detail regarding a position of a service light and light fields, refer to FIGS. 2B-2E.

By including the two portions, a locking mechanism and a management component may be housed in either of chassis ears 109A-109B without extending into front access area 108 and/or any other portion of data processing system 100. Additionally, when a security bezel is secured by the latches, the security bezel may secure the service lights (e.g., by protecting them from being accessed from a front of chassis 106).

While illustrated in FIG. 1B with a limited number of specific components, a data processing system may include additional, fewer, and/or different components without departing from embodiments disclosed herein.

Figure 2A:
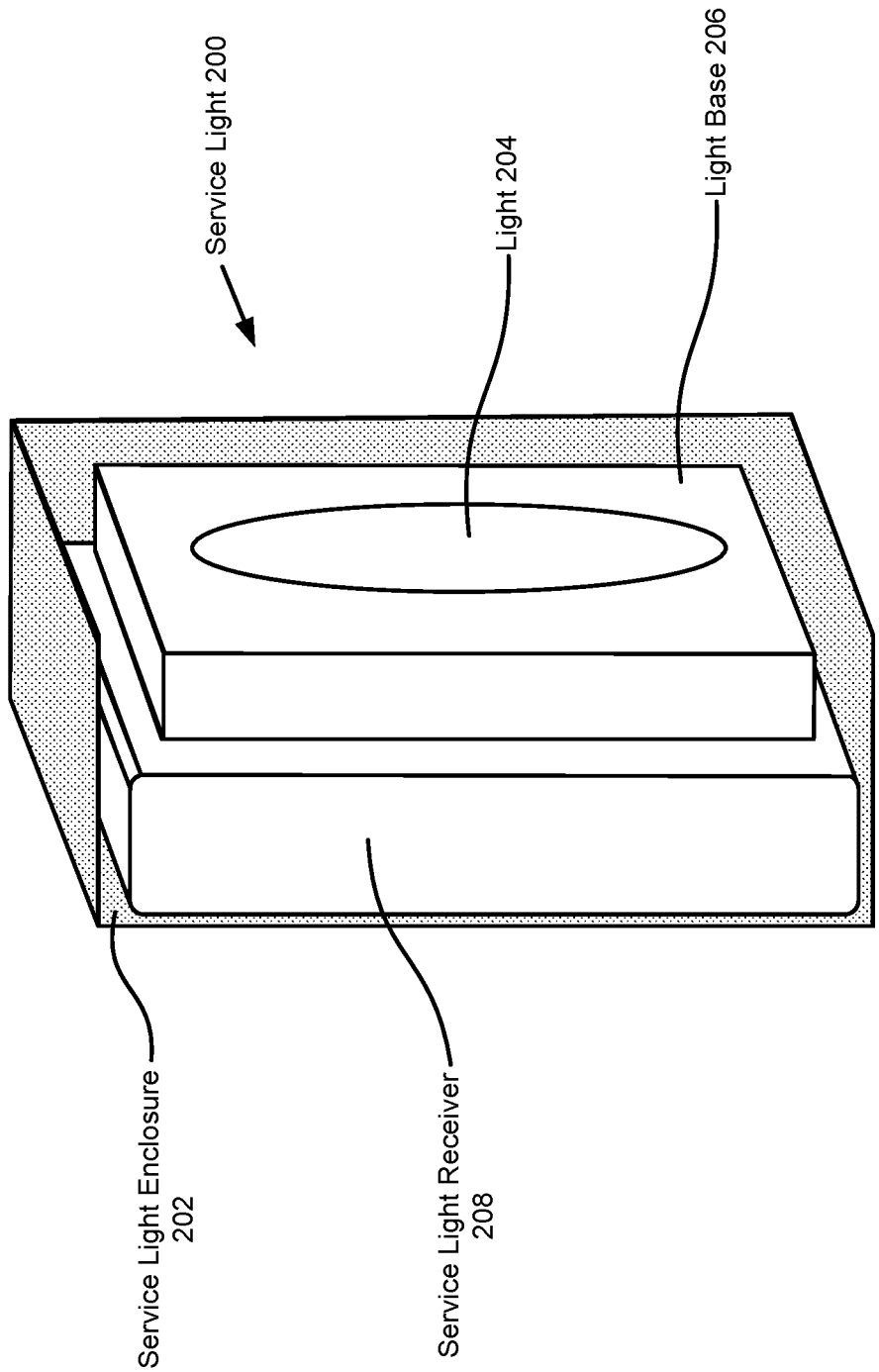
FIGS. 2A-2C show diagrams illustrating a service light in accordance with an embodiment.

Turning to FIG. 2A, a first diagram illustrating service light 200 in accordance with an embodiment is shown. It will be appreciated that service light 200 may be similar to the service lights discussed with respect to FIG. 1B (e.g., 112A-112B) and may be integrated with data processing system 100.

As previously discussed, a service light (e.g., 200) may illuminate portions of a data processing system, thereby enabling visibility of the portions even while the portions are positioned in dark or dim environments. To provide its functionality, service light 200 may include service light enclosure 202, light 204, light base 206, and service light receiver 208, each of which is discussed below.

Service light enclosure 202 may house components of service light 200. To do so, service light enclosure 202 may be implemented with an enclosure in which physical structures of service light 200 may be at least temporarily positioned. Additionally, service light enclosure 202 may be permanently positioned with the second portion of an ear (as discussed with regard to FIG. 1B).

Light 204 may, while operating, project a light field as discussed in FIG. 1A-1B. To do so, light 204 may include a source of illumination such as a light emitting diode (LED) (e.g., and/or other components for directing and managing generated light), and access to a source of power such as a battery.

Light base 206 may impart stability to light 204 while, in some cases, providing power to light 204. To do so, light base 204 may be a structure on which light 204 is positioned, and in some cases, may include a battery that powers light 204. For example, light base 204 may be a plastic part fabricated with plastic injection molding.

Service light receiver 208 may receive light base 206 when service light 200 is placed in a rest position. In some cases, service light receiver 208 may include access to power (e.g., from a power supply within a chassis) and may recharge the battery of light base 208 and/or provide power to light 204 directly. To do so, service light receiver may be implemented with, for example, a structure integrated with a power supply (e.g., an independent power supply and/or a power line attached to a different power supply). For additional information regarding the service light receiver, refer to FIG. 2B-2C.

While illustrated in FIG. 2A with a limited number of specific components, a service light may include additional, fewer, and/or different components without departing from embodiments disclosed herein.

Figure 2B:
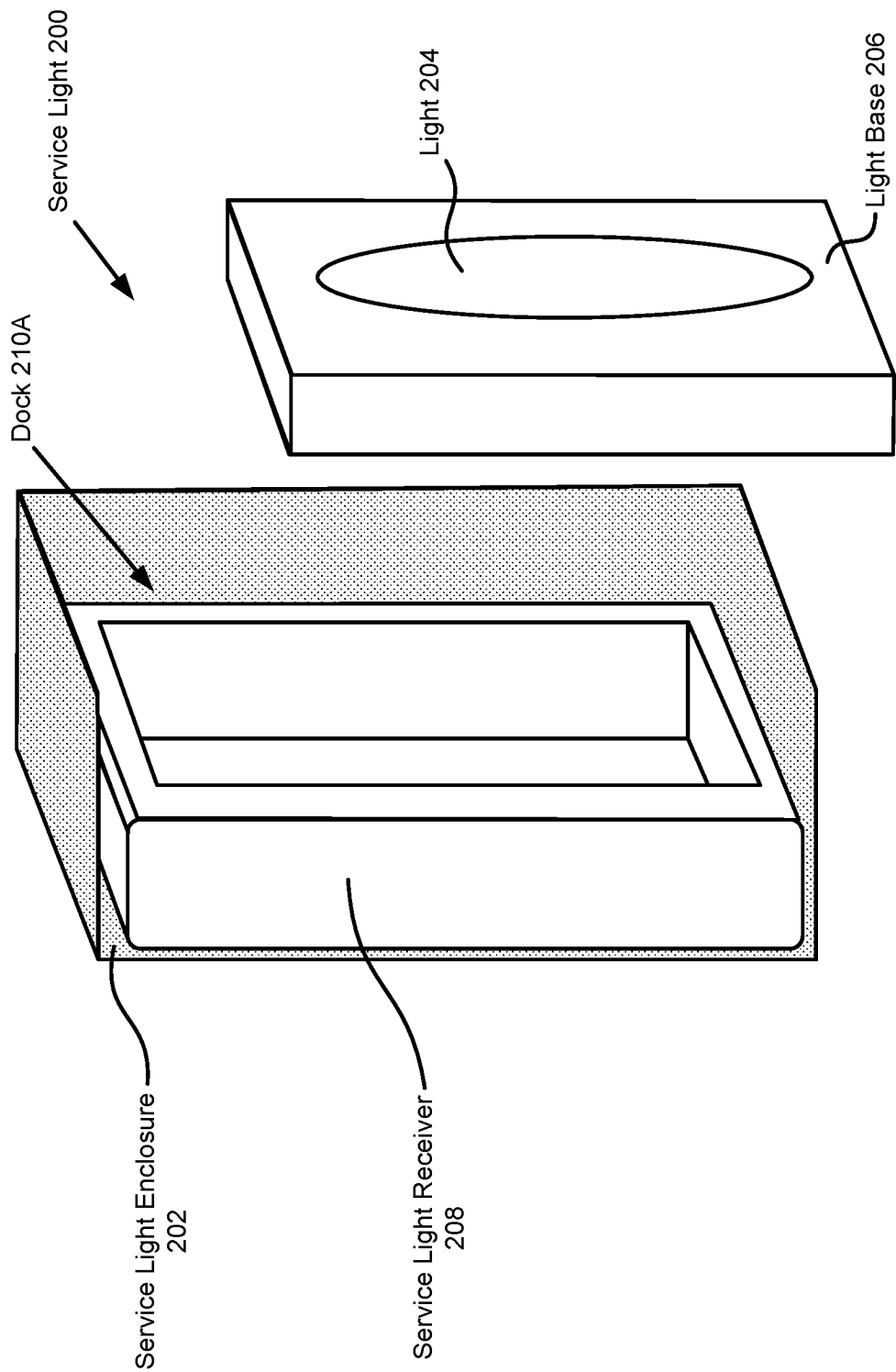
Figure 2C:
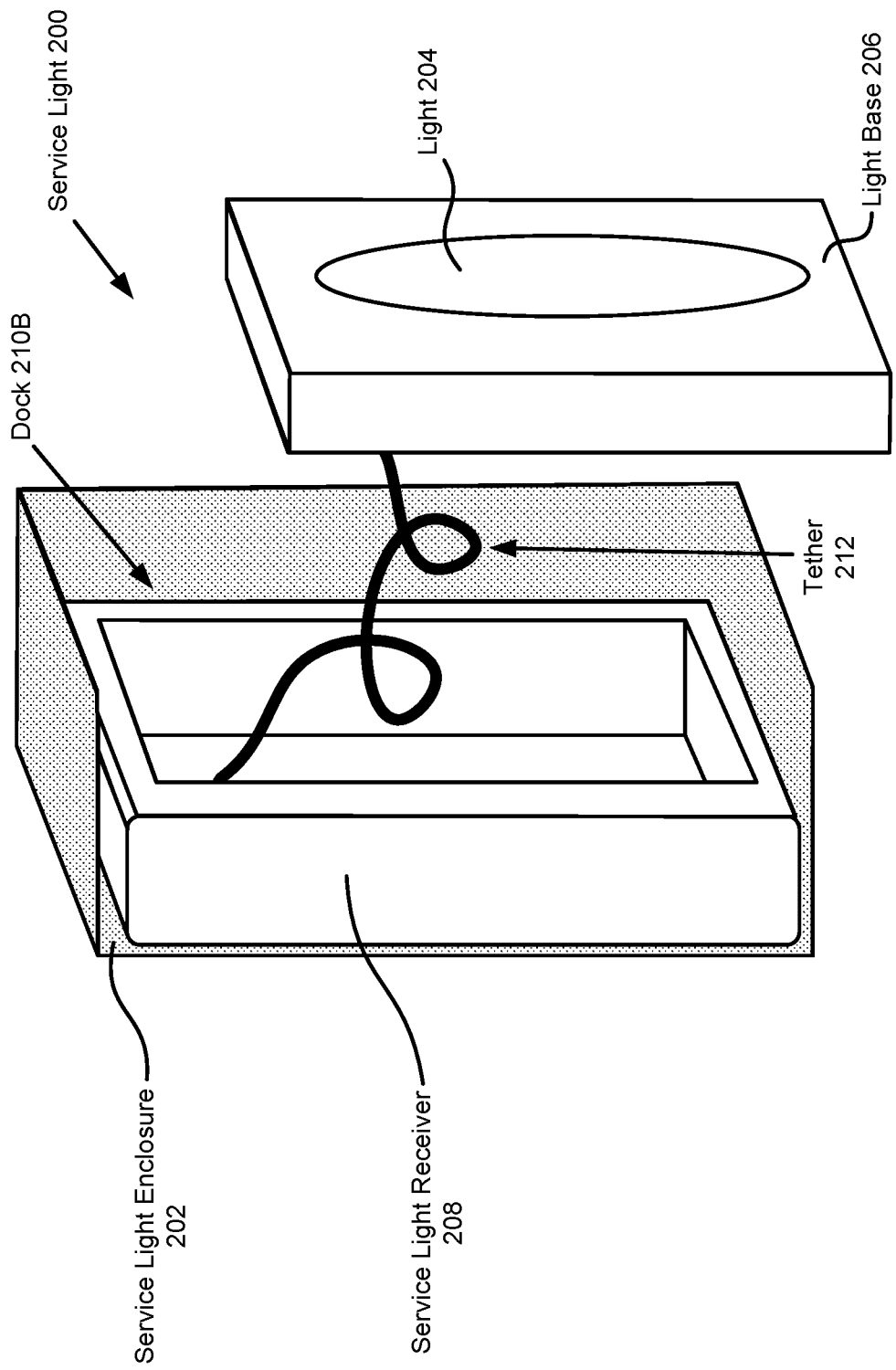

Turning to FIGS. 2B-2C, a second and a third diagram illustrating service light 200 in accordance with an embodiment is shown.

As noted above, physical structures of service light 200 may be at least temporarily positioned in service light enclosure 202. For example, light base 206 may be positioned in service light enclosure 202 while service light 200 is in a rest position, as shown in FIG. 2A. However, when service light 200 is placed in an active position (e.g., outside of service light enclosure 202), light base 206 may be detached from service light receiver 208 and removed from service light enclosure 202, as shown in FIG. 2B.

To facilitate attachment and/or detachment of light base 206 from service light receiver 208, service light receiver 208 may include dock 210A.

Dock 210A may, for example, include structural members adapted to physically couple with corresponding structural members of light base 206. Additionally, to provide power to light 204, dock 210A may facilitate charging of light base 206 while attached to light base 206 (e.g., may include a magnetic charging system, physical charging system, etc.).

In an embodiment, as shown in FIG. 2C, to facilitate attachment and/or detachment of light base 206 from service light receiver 208, service light receiver 208 may include dock 210B. Similar to dock 210A, dock 210B may include structural members adapted to physically couple with corresponding structural members of light base 206. In contrast to dock 210A, dock 210B may provide power to light 204 while service light 200 is in a rest position or an active position. To do so, dock 210B may include tether 212.

Tether 212 may anchor light base 206 to service light receiver 208 while service light 200 is in an active position. Additionally, tether 212 may supply power to light base 206 and/or light 204 while in the rest position and the active position. To do so, tether 212 may be implemented with a cable (e.g., a power line). It will be appreciated, however, that in some cases tether 212 may not provide power and may instead only facilitate anchoring light base 206 to service light receiver 208.

While illustrated in FIGS. 2B-2C with a limited number of specific components, a service light may include additional, fewer, and/or different components without departing from embodiments disclosed herein.

Figure 2D:
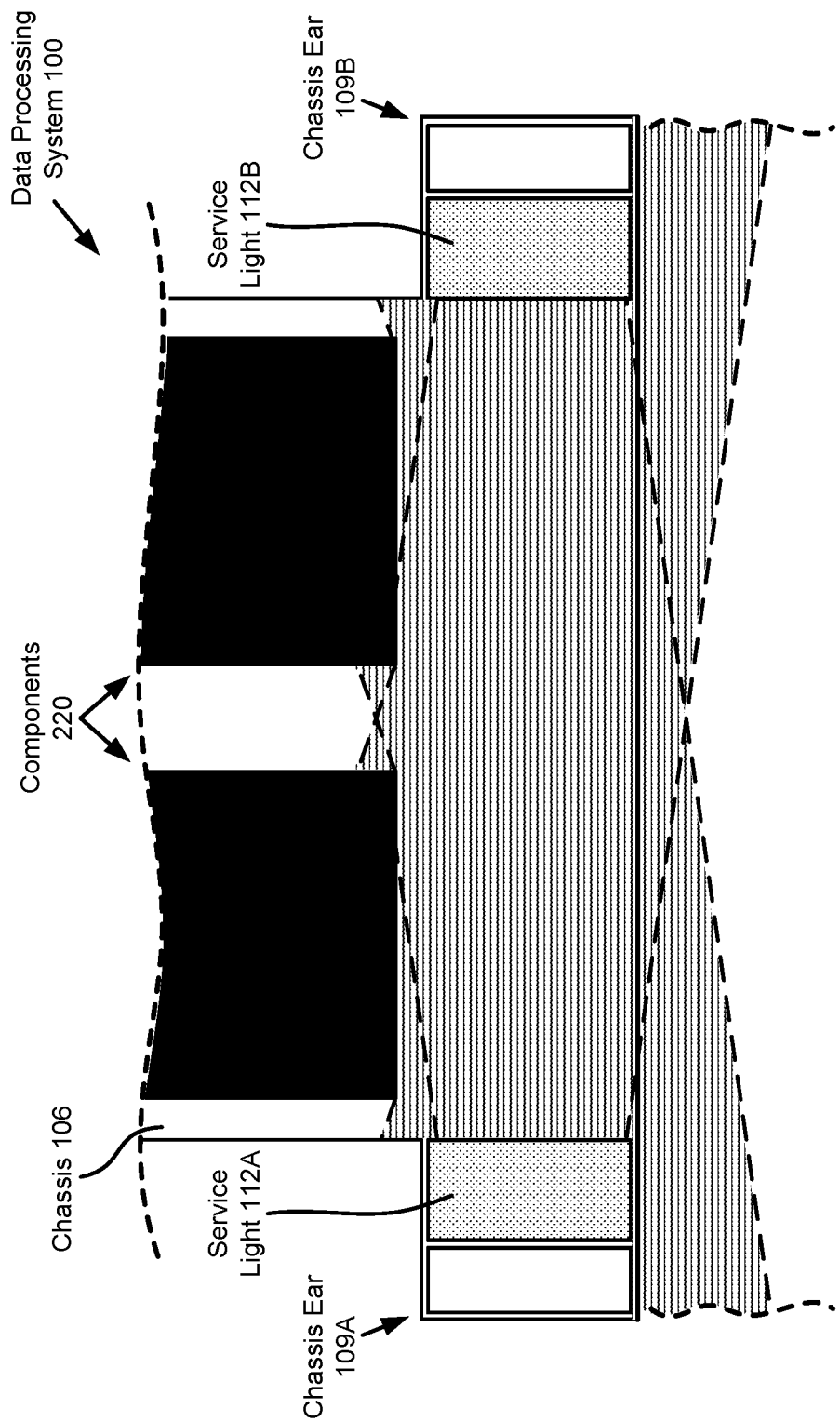
FIGS. 2D-2E show block diagrams illustrating a system in accordance with an embodiment.

Turning to FIG. 2D, a third diagram illustrating a data processing system in accordance with an embodiment is shown. The viewpoint of FIG. 2D may be a top view of chassis 106.

As previously discussed, the hardware components of data processing system 100 may need to be in a predetermined operating state to contribute toward the performance of desired computer implemented services. However, if the hardware components are not in the predetermined operating state, various maintenance actions for the hardware components may need to be performed.

To do so, data processing system 100 may include a source of illumination integrated with chassis 106. For example, the source of illumination may be integrated with one or more ears of chassis 106 (e.g., service light 112A, 112B, and or 200).

For example, assume a scenario in which data processing system 100 includes a number of physical hard drives (e.g., components 220) housed within chassis 106 and accessible through a front of chassis 106. Additionally, assume the environment in which chassis 106 resides is dimly lit, resulting in a lack of visibility within chassis 106.

One day, a technician is notified of a hard drive failure within data processing system 100, and therefore, the technician presumes that one of the physical hard drives (e.g., one of components 220) has failed. The technician may then travel to the site of data processing system 100 to visually inspect, physically interact, and/or otherwise be able to identify and interact with the hardware components to perform maintenance on data processing system 100 (e.g., to return data processing system 100 to a predetermined operating state of the system prior to the hard drive failure).

To perform the maintenance, the technician may approach chassis 106, remove any obstructions (e.g., a security bezel) from a front of chassis 106, and attempt to visually identify a cause of the notification such as a failed hard drive. However, as noted above, the environment is dimly lit. Consequently, the technician utilizes service lights 112A-112B to identify at least a front row of components within chassis 106.

As shown in FIG. 2D, service lights 112A-112B may face one another from their respective rest positions in chassis ears 109A-109B. While facing one another, service lights 112A-112B may project light fields (depicted with dotted outlines and horizontally lined infill patterns) across the front access area, the light fields extending a distance outside of the opening and illuminating a front of components 220.

If the projected light fields are sufficient to allow the technician to identify the components, then the technician may proceed with the repair. For example, the technician may remove and replace a defective component; may retrieve, modify and then place the modified component back in chassis 106; and/or may perform other actions to remediate impaired devices.

However, although the technician has visibility of the front row, the technician may determine that a further look within chassis 106, behind the front row, may be needed to identify the cause of the notification. For example, the defective component may be positioned further back within chassis 106 where the projected light fields by services lights 111A-11B may not reach.

Figure 2E:
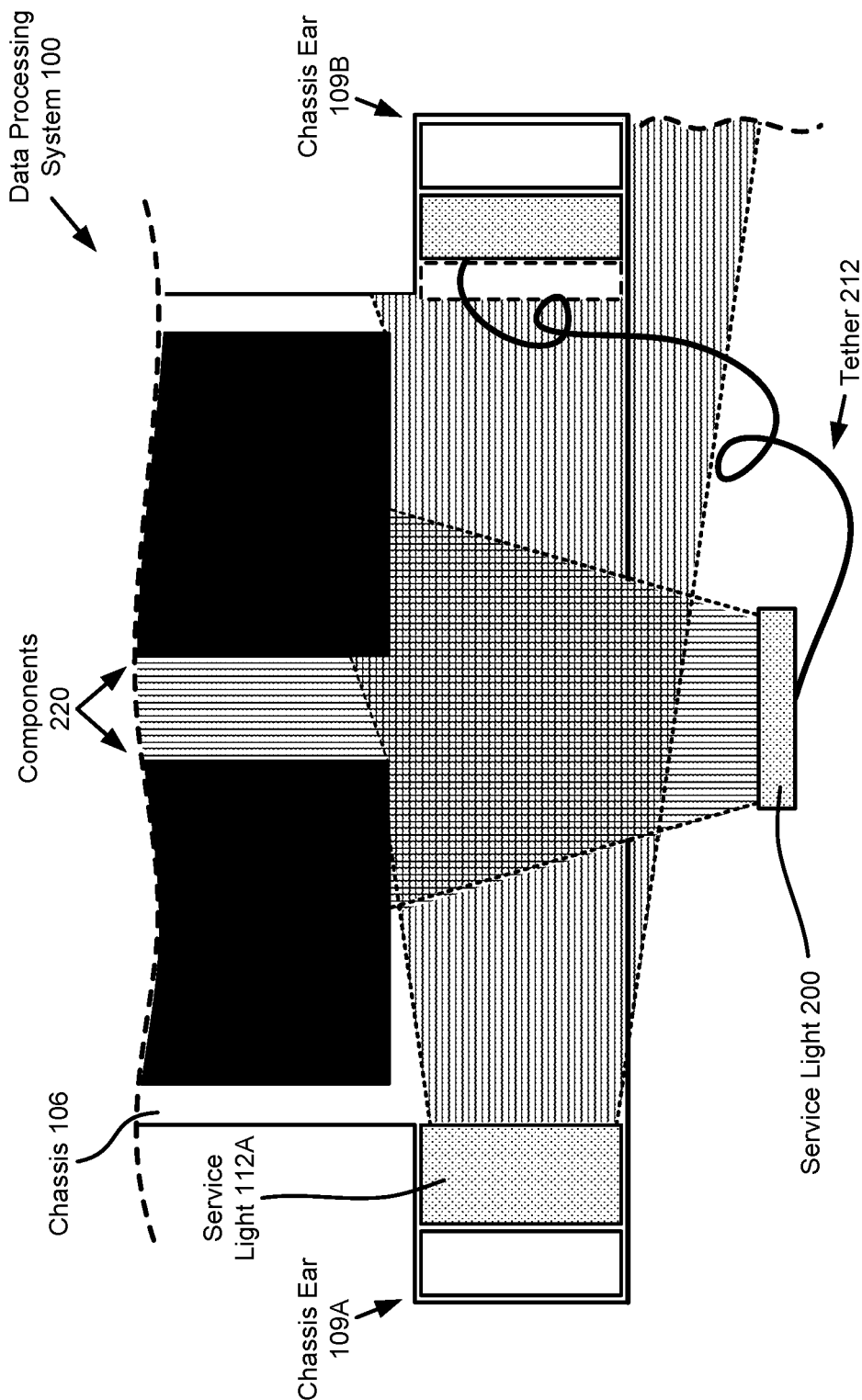

Turning to FIG. 2E, a fourth diagram illustrating a data processing system in accordance with an embodiment is shown. In FIG. 2E, assume that instead of service light 112B being housed in chassis ear 109B, service light 200 (as discussed in FIG. 2C) is housed in chassis ear 109B throughout the scenario in FIG. 2D.

Continuing with the discussion from FIG. 2D, to look further within chassis 106, the technician may proceed to remove a top cover of chassis 106, thereby uncovering a dark interior of chassis 106. The technician may then remove service light 200 from chassis ear 109B (placing service light 200 in an active position). While removed, service light 200 may remain powered by tether 212 (and/or battery power if powered by batteries) and continue to project a light field. The technician may then lift service light 200 above chassis 106 (and/or otherwise reposition/orient service light) and direct its light field (depicted with a vertically lined infill pattern) to illuminate the interior of chassis 106.

By doing so, the technician may be able to correctly identify the failed hard drive, proceed with maintenance to rectify the hard drive failure and return data processing system 100 to its predetermined operating state, and/or perform other diagnostic/maintenance actions.

Once maintenance has been completed, the technician may return any service lights in an active position to respective rest positions before placing the top cover and security bezel back onto chassis 106, thereby securing components housed within chassis 106.

While illustrated in FIGS. 2D-2E with a limited number of specific components, a data processing system may include additional, fewer, and/or different components without departing from embodiments disclosed herein.

Figure 3:
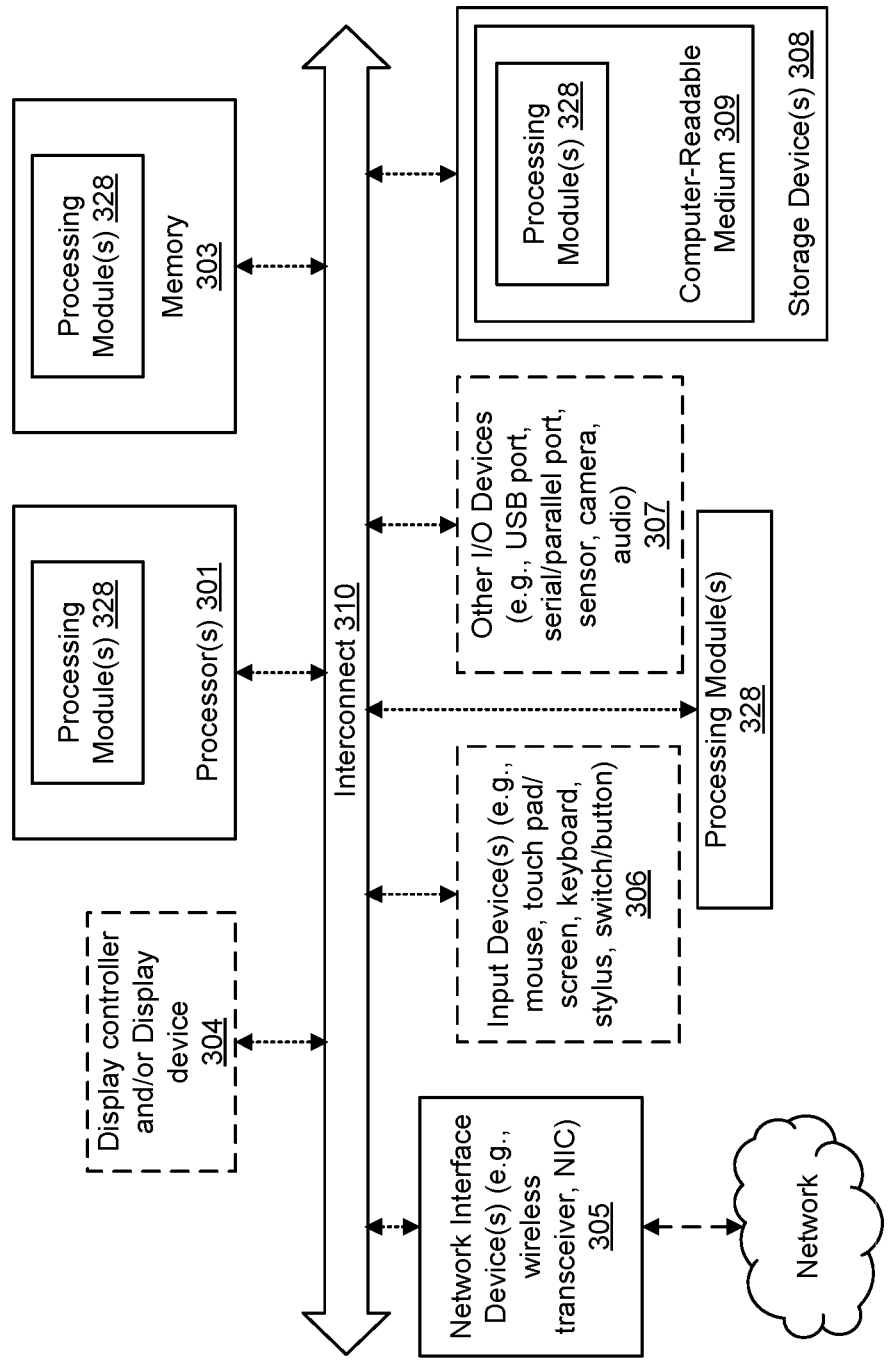
FIG. 3 shows a block diagram illustrating a data processing system in accordance with an embodiment.

Any of the components illustrated in FIGS. 1A-2E may be implemented with and/or used in conjunction with one or more computing devices. For example, the security bezel may be used to secure a chassis in which components of a data processing system may be positioned (e.g., processors, memory, etc.). Turning to FIG. 3, a block diagram illustrating an example of a data processing system (e.g., a computing device) in accordance with an embodiment is shown. For example, system 300 may represent any of data processing systems described above performing any of the processes or methods described above. System 300 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 300 is intended to show a high-level view of many components of the computer system. However, it is to be understood that additional components may be present in certain implementations and furthermore, different arrangement of the components shown may occur in other implementations. System 300 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 300 includes processor 301, memory 303, and devices 305-307 via a bus or an interconnect 310. Processor 301 may represent a single processor or multiple processors with a single processor core or multiple processor cores included therein. Processor 301 may represent one or more general-purpose processors such as a microprocessor, a central processing unit (CPU), or the like. More particularly, processor 301 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 301 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 301, which may be a low power multi-core processor socket such as an ultra-low voltage processor, may act as a main processing unit and central hub for communication with the various components of the system. Such processor can be implemented as a system on chip (SoC). Processor 301 is configured to execute instructions for performing the operations discussed herein. System 300 may further include a graphics interface that communicates with optional graphics subsystem 304, which may include a display controller, a graphics processor, and/or a display device.

Processor 301 may communicate with memory 303, which in one embodiment can be implemented via multiple memory devices to provide for a given amount of system memory. Memory 303 may include one or more volatile storage (or memory) devices such as random-access memory (RAM), dynamic RAM (DRAM), synchronous DRAM (SDRAM), static RAM (SRAM), or other types of storage devices. Memory 303 may store information including sequences of instructions that are executed by processor 301, or any other device. For example, executable code and/or data of a variety of operating systems, device drivers, firmware (e.g., input output basic system or BIOS), and/or applications can be loaded in memory 303 and executed by processor 301. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 300 may further include IO devices such as devices (e.g., 305, 306, 307, 308) including network interface device(s) 305, optional input device(s) 306, and other optional IO device(s) 307. Network interface device(s) 305 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 306 may include a mouse, a touch pad, a touch sensitive screen (which may be integrated with a display device of optional graphics subsystem 304), a pointer device such as a stylus, and/or a keyboard (e.g., physical keyboard or a virtual keyboard displayed as part of a touch sensitive screen). For example, input device(s) 306 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 307 may include an audio device. An audio device may include a speaker and/or a microphone to facilitate voice-enabled functions, such as voice recognition, voice replication, digital recording, and/or telephony functions. Other IO devices 307 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 307 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 310 via a sensor hub (not shown), while other devices such as a keyboard or thermal sensor may be controlled by an embedded controller (not shown), dependent upon the specific configuration or design of system 300.

To provide for persistent storage of information such as data, applications, one or more operating systems and so forth, a mass storage (not shown) may also couple to processor 301. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 301, e.g., via a serial peripheral interface (SPI). This flash device may provide for non-volatile storage of system software, including a basic input/output software (BIOS) as well as other firmware of the system.

Storage device 308 may include computer-readable storage medium 309 (also known as a machine-readable storage medium or a computer-readable medium) on which is stored one or more sets of instructions or software (e.g., processing module, unit, and/or processing module/unit/logic 328) embodying any one or more of the methodologies or functions described herein. Processing module/unit/logic 328 may represent any of the components described above. Processing module/unit/logic 328 may also reside, completely or at least partially, within memory 303 and/or within processor 301 during execution thereof by system 300, memory 303 and processor 301 also constituting machine-accessible storage media. Processing module/unit/logic 328 may further be transmitted or received over a network via network interface device(s) 305.

Computer-readable storage medium 309 may also be used to store some software functionalities described above persistently. While computer-readable storage medium 309 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 328, components and other features described herein can be implemented as discrete hardware components or integrated in the functionality of hardware components such as ASICS, FPGAs, DSPs or similar devices. In addition, processing module/unit/logic 328 can be implemented as firmware or functional circuitry within hardware devices. Further, processing module/unit/logic 328 can be implemented in any combination hardware devices and software components.

Note that while system 300 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system, comprising:
   a chassis comprising:
      a payload area to:
         house hardware components,
         facilitate introduction of at least a portion of the hardware components to an interior of the chassis, and
         facilitate removal of the at least a portion of the hardware components from the interior of the chassis, and
      an ear positioned with a front of the chassis and to a side of the payload area, the chassis being separate and different from a rack system to which the chassis is configured to be attached; and the hardware components positioned with the chassis;

a service light adapted to illuminate portions of the data processing system; and a service light receiver that is positioned with the ear and adapted to:

receive the service light to retain the service light in a first position and a first orientation.

2. The data processing system of claim 1, wherein while received by the service light receiver, the service light is positioned in the ear.

3. The data processing system of claim 2, wherein while received by the service light receiver, the service light is adapted to project a light field directed toward an interior of the chassis to illuminate a first portion of the portions of the data processing system.

4. The data processing system of claim 3, wherein the projected light field is oriented, at least in part, from the ear of the chassis toward a second ear of the chassis.

5. The data processing system of claim 1, wherein the service light receiver is adapted to power the service light.

6. The data processing system of claim 5, wherein the service light receiver comprises a dock for the service light, and the service light comprises a rechargeable battery charged using the dock while the service light is received by the service light receiver.

7. The data processing system of claim 5, wherein the service light receiver comprises a tether to the service light.

8. The data processing system of claim 7, wherein the tether supplies power to the service light.

9. The data processing system of claim 1, wherein while the service light is detached from the service light receiver, the service light is unrestricted in its position and orientation to illuminate at least a second portion of the portions of the data processing system.

10. The data processing system of claim 1, wherein while received by the service light receiver, the service light does not restrict access to the at least the portion of the hardware components.

11. The data processing system of claim 1, further comprising:

a security bezel adapted to reversibly attach to the chassis, and when attached to the chassis the security bezel limits access to the service light.

12. A rack system, comprising:

an enclosure system for data processing systems;

a data processing system of the data processing systems, the data processing system comprising:

a chassis comprising:

a payload area to house hardware components, facilitate introduction of at least a portion of the hardware components to an interior of the chassis, and facilitate removal of the at least a portion of the hardware components from the interior of the chassis, and an ear positioned with a front of the chassis and to a side of the payload area; and the hardware components positioned with the chassis;

a service light adapted to illuminate portions of the data processing system; and a service light receiver that is positioned with the ear and adapted to:

receive the service light to retain the service light in a first position and a first orientation.

13. The rack system of claim 12, wherein while received by the service light receiver, the service light is positioned in the ear.

14. The rack system of claim 13, wherein while received by the service light receiver, the service light is adapted to project a light field directed toward an interior of the chassis to illuminate a first portion of the portions of the data processing system.

15. The rack system of claim 14, wherein the projected light field is oriented, at least in part, from the ear of the chassis toward a second ear of the chassis.

16. The rack system of claim 12, wherein the service light receiver is adapted to power the service light.

17. The rack system of claim 16, wherein the service light receiver comprises a dock for the service light, and the service light comprises a rechargeable battery charged using the dock while the service light is received by the service light receiver.

18. The rack system of claim 15, wherein the service light receiver comprises a tether to the service light.

19. The rack system of claim 12, wherein while the service light is detached from the service light receiver, the service light is unrestricted in its position and orientation to illuminate at least a second portion of the portions of the data processing system.

20. The rack system of claim 12, wherein while received by the service light receiver, the service light does not restrict access to at least a portion of the hardware components.

\* \* \* \* \*